(12) United States Patent
Yoshikawa

(10) Patent No.: US 6,243,852 B1
(45) Date of Patent: Jun. 5, 2001

(54) METHOD OF AND AN APPARATUS FOR LOGIC CIRCUIT SYNTHESIS

(75) Inventor: Ko Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/144,503

(22) Filed: Aug. 31, 1998

(30) Foreign Application Priority Data

Aug. 29, 1997 (JP) .................................................. 9-247484

(51) Int. Cl.$^7$ ...................................................... G06F 17/50
(52) U.S. Cl. ............................................... 716/18; 716/2
(58) Field of Search .......................................... 716/1–21

(56) References Cited

U.S. PATENT DOCUMENTS

| | | | |
|---|---|---|---|
| 5,258,919 | * 11/1993 | Yamanouchi et al. | 716/11 |
| 5,465,216 | * 11/1995 | Rotem et al. | 716/5 |
| 5,475,605 | * 12/1995 | Lin | 716/6 |
| 5,537,330 | * 7/1996 | Damiano et al. | 716/18 |
| 5,544,071 | * 8/1996 | Keren et al. | 716/6 |
| 5,644,498 | * 7/1997 | Joly et al. | 716/2 |
| 5,740,070 | * 4/1998 | Nishimoto et al. | 716/11 |
| 5,892,687 | * 4/1999 | Moricz et al. | 716/2 |
| 5,949,691 | * 9/1999 | Kurosaka et al. | 716/5 |
| 5,953,519 | * 9/1999 | Fura | 716/18 |

FOREIGN PATENT DOCUMENTS 10-222550   8/1998   (JP) ................................. G06F/17/50

OTHER PUBLICATIONS

L. Stok et al. ("BooleDozer: Logic Synthesis for ASICs", IBM J. Res. Develop., vol. 40, No. 4, Jul. 1996, pp. 407–430).*

* cited by examiner

*Primary Examiner*—Matthew Smith
*Assistant Examiner*—Phallaka Kik
(74) *Attorney, Agent, or Firm*—Foley & Lardner

(57) ABSTRACT

For enabling to easily and efficiently perform analysis, logical checks and revisions of a logic circuit synthesized with automatic logic circuit synthesis, an apparatus for automatically synthesizing a logic circuit according to a description of the logic circuit using a HDL comprises means (2 to 8) for generating a logic circuit (11) according to a HDL description (1) always retaining boundary information concerning of necessary intermediate signals defined in the HDL description; and a correspondence list output section (9) for outputting a correspondence list (10) describing information of each respective point of the logic circuit (11) corresponding to each of the necessary intermediate signals, by editing the boundary information. The necessary intermediate signals may be all intermediate signals defined in the HDL description (1), or may be variable intermediate signals defined in the HDL description (1) and referred to by more than a predetermined number of nodes of the logic circuit (11).

15 Claims, 9 Drawing Sheets

METHOD OF AND AN APPARATUS FOR LOGIC CIRCUIT SYNTHESIS

BACKGROUND OF THE INVENTION

The present invention relates to a method of and all apparatus for logic circuit synthesis for automatically synthesizing a logic circuit according to a description of the logic circuit using a HDL (High-level Design Language) and a recording medium wherein a program for a computer performing the logic circuit synthesis according to the method is recorded.

As one of prior arts of the logic circuit synthesis, there is known a method disclosed in "BooleDozer: Logic synthesis for ASICs" by L. Stok et al., IBM J. RES. DEVELOP., VOL. 49, NO. 4, pp. 407–430 (July 1996).

FIG. 11 is a block diagram schematically illustrating a structural flow of the above prior art.

Referring to FIG. 11, the prior art apparatus comprises a compiler section 104, a technology-independent optimization section 105, a technology mapping section 106, a timing optimization section 107, a logic circuit output section 108, a semiconductor library 103 and an inner database 102 used by the above sections.

The compiler section 104 compiles a HDL description 101 into a logical network composed of logical blocks including equation blocks, functional blocks such as adders and multiplexers, and primitive gates. The logical network is stored in the inner database 102.

The technology-independent optimization section 105 performs technology-independent optimization of the logical network. Here, the technology-independent optimization means optimization not considering concrete hardware configurations of the logical blocks. In this prior art example, optimization methods such as so-called the constant propagation, the redundancy removal, the global flow analysis, the transduction, the cube factoring, and the kernel factoring are applied for the technology-independent optimization.

Then, referring to the semiconductor library 103, the technology mapping section 106 generates a hardware network by assigning a matching hardware unit to each of the logical blocks of the logical network after processed through the technology-independent optimization section 105. The hardware network is stored in the inner database 102.

The timing optimization section 107 performs optimization of the hardware network referring to the semiconductor library 103, making use of optimization methods such as so-called the fan-out correction, the fan-in reordering, the decomposition, and the inverter motion.

Finally, the logic circuit output section 108 generates a logic circuit 111 to be output referring to the semiconductor library 103 according to the hardware network after processed through the timing optimization section 107.

Thus, a logic circuit is synthesized according to a HDL description in the prior art example.

However, in the conventional logic circuit synthesis such as above described, there has been a problem that one-to-one correspondences are not all retained between the HDL description and the logic circuit synthesized according thereto. This is because part of the information in the HDL description disappears in the process of the optimization.

For example, following logic in the HDL description;
S=(A and C) or (A and D) or (B and C) or (B and D),
P=(A and S), and
Q=(B and S),
is transformed, as the result of optimization according to the transduction, into another logic as follows;
S'=(C or D)
P=(A and S'), and
Q=(B and S').

Thus, all intermediate signal S=(A and C) or (A and D) or (B and C) or (B and D) defined in the HDL description 101 is replaced with different intermediate signal S'=(C or D) in the synthesized logic circuit 111, according to the prior art logic circuit synthesis. Here, the intermediate signal means a signal other than input/output signals of a logic circuit itself designed with a HDL module or output signals of sequential hardware units such as a flip-flop in the logic circuit. Similar omissions or deformations occur through the other optimization methods than the transduction.

When a logic circuit is sufficient to be once synthesized simply, the correspondence between the logic circuit and the HDL description may not be necessary to be referred to.

However, in most cases, the synthesized logic circuit should be checked as to whether it functions correctly as intended by the designer making use of detailed simulation, for example, even if the logic circuit is correctly synthesized according to a HDL description. This is because the logic circuit synthesis cannot check for a the designer's intention itself even if it can check logical inconsistency in the HDL description. Further, the designer may intend to revise the HDL description for improving performance of the synthesized logic circuit concerning a critical path thereof.

In these cases, it is difficult for the designer to correctly search corresponding parts of the HDL description when information of the intermediate signals is omitted or deformed automatically through the optimization.

When no optimization is applied, the above problem does not occur, of course, but performance (in area, delay and power) of the synthesized logic circuit would be too degraded.

SUMMARY OF THE INVENTION

Therefore, a primary object of the present invention is to provide a method of and an apparatus for logic circuit synthesis wherein a point, whereto each of intermediate signals defined in a HDL description corresponds, can be easily discriminated in a logic circuit synthesized from the HDL description, for enabling a designer to perform analysis, logical checks and revisions of the synthesized logic circuit easily and efficiently.

Another object of the present invention is to provide a method of and an apparatus for logic circuit synthesis wherein boundary information of unnecessary intermediate signals in the HDL description is allowed to be omitted, when priority is to be given to optimization performance in the logic circuit synthesis. Still another object of the invention is to provide a recording medium wherein a program for a computer performing the logic circuit synthesis according to the above inventions is recorded.

In order to achieve the object, a method of logic circuit synthesis for automatically synthesizing a logic circuit according to a description of the logic circuit using a HDL comprises steps of:

generating a logic circuit according to a HDL description always retaining boundary information concerning necessary intermediate signals defined in the HDL description; and outputting a correspondence list describing information of each respective point of the logic circuit corresponding to each of the necessary intermediate signals, by editing the boundary information.

The necessary intermediate signals may be all intermediate signals defined in the HDL description, or may be variable intermediate signals defined in the HDL description and referred to by more than a predetermined number of nodes of the logic circuit.

Therefore, any point in the logic circuit, whereto the intermediate signals corresponds, can be easily discriminated, and the designer can easily and efficiently perform analysis, logical checks and revisions of the synthesized logic circuit referring to the correspondence list.

Further, when priority is to be given to optimization performance, boundary information of unnecessary intermediate signals is allowed to be omitted, in the logic circuit synthesis according to the invention.

Describing more concretely, the method of logic circuit synthesis according to the invention comprises steps of:

compiling a HDL description into a logical network, wherein boundary information concerning intermediate signals defiled in the HDL description is included;

performing technology-independent optimization of the logical network retaining the boundary information;

transforming the logical network into a hardware network retaining the boundary information, by assigning a matching hardware unit in a semiconductor library to each of logical blocks of the logical network after performing the technology-independent optimization;

performing optimization of the hardware network referring to the semiconductor library and retaining the boundary information, the optimization being performed concerning at least one of circuit size, operational speed and power consumption of a logic circuit to bc designed according to the hardware network;

generating the logic circuit to be output referring to the semiconductor library according to the hardware network after performing the optimization; and outputting a correspondence list describing information of each respective point of the logic circuit corresponding to each of intermediate signals included in the boundary information, by editing the boundary information.

The step of compiling comprises steps of:

generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals;

extracting the boundary information from the primitive logical network by searching the primitive logical network for every node accompanied by a signal name; and erasing each node accompanied by a signal name in the primitive logical network, by attaching the boundary information including the signal name to a preceding node of the node and connecting every of following node of the node to the preceding node.

The method of logic circuit synthesis according to the invention may further comprise steps of:

performing constant propagation optimization of the logical network to be performed following the step of compiling, wherein the boundary information concerning intermediate signals found to be constant is allowed to be erased; and performing boundary information reduction by checking whether a fan-out number of a node is more or not than a predetermined number for every node of the logical network accompanied by the boundary information concerning any of the intermediate signals, and erasing the boundary information of nodes each giving the fan-out number not more than the predetermined number;

Further, an apparatus for logic circuit synthesis according to the invention comprises:

a compiler section for compiling a HDL description into a logical network, wherein boundary information concerning intermediate signals defined in the HDL description is included;

a technology-independent optimization section for performing technology-independent optimization of the logical network retaining the boundary information;

a technology mapping section for transforming the logical network into a hardware network retaining the boundary information, by assigning a matching hardware unit in cl semiconductor library to each of logical blocks of the logical network after processed with the technology-independent optimization;

a timing optimization section for performing optimization of the hardware network referring to the semiconductor library and retailing the boundary information, the optimization being performed concerning at least one of circuit size, operational speed and power consumption of a logic circuit to be designed according to the hardware network;

a logic circuit output section for generating the logic circuit to be output referring to the semiconductor library according to the hardware network after processed with the optimization; and a correspondence list output section for outputting a correspondence list describing information of each respective point of the logic circuit corresponding to each of intermediate signals included in the boundary information, by editing the boundary information.

The compiler section comprises:

a translator for generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals; and a boundary information generating section for extracting the boundary information from the primitive logical network by searching the primitive logical network for every node accompanied by a signal name, and erasing each node accompanied by a signal name in the primitive logical network, by attaching the boundary information including the signal name to a preceding node of the node and connecting every of following node of the node to the preceding node.

The apparatus for logic circuit synthesis may further comprises:

a constant propagation section for performing constant propagation optimization of the logical network wherein the boundary information concerning intermediate signals found to be constant is allowed to be erased; and a reference number checking section for performing boundary information reduction by checking whether a fan-out number of a node is more or not than a predetermined number for every node of the logical network accompanied by the boundary information concerning alkyl of the intermediate signals, and erasing the boundary information of nodes each giving the fan-out number not more than the predetermined number;

Still further, a recording medium of the invention is recorded with a computer program to be implemented with a computer for performing a procedure to automatically synthesize a logic circuit according to a description of the logic circuit using a HDL, wherein the procedure comprises steps of:

compiling a HDL description into a logical network, wherein boundary information concerning intermediate signals defined in the HDL description is included;

performing technology-independent optimization of the logical network retaining the boundary information;

transforming the logical network into a hardware network retaining the boundary information, by assigning a matching hardware unit in a semiconductor library to each of logical blocks of the logical network after performing the technology-independent optimization;

performing optimization of the hardware network referring to the semiconductor library mid retaining the boundary information, the optimization being performed concerning at least one of circuit size, operational speed and power consumption of a logic circuit to be designed according to the hardware network;

generating the logic circuit to be output referring to the semiconductor library according to the hardware network after performing the optimization; and outputting a correspondence list describing information of each respective point of the logic circuit corresponding to each of intermediate signals included in the boundary information, by editing the boundary information.

The above step of compiling comprises steps of:

generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals;

extracting the boundary information from the primitive logical network by searching the primitive logical network for every node accompanied by a signal name; and erasing each node accompanied by a signal name in the primitive logical network, by attaching the boundary information including the signal name to a preceding node of the node and connecting every of following node of the node to the preceding node.

The procedure to automatically synthesize a logic circuit may further comprise steps of:

performing constant propagation optimization of the logical network to be performed following the step of compiling, wherein the boundary information concerning intermediate signals found to be constant is allowed to be erased; and performing boundary information reduction by checking whether a fail-out number of a node is more or not than a predetermined number for every node of the logical network accompanied by the boundary information concerning any of the intermediate signals, and erasing the boundary information of nodes each giving the fan-out number not more than the predetermined number.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
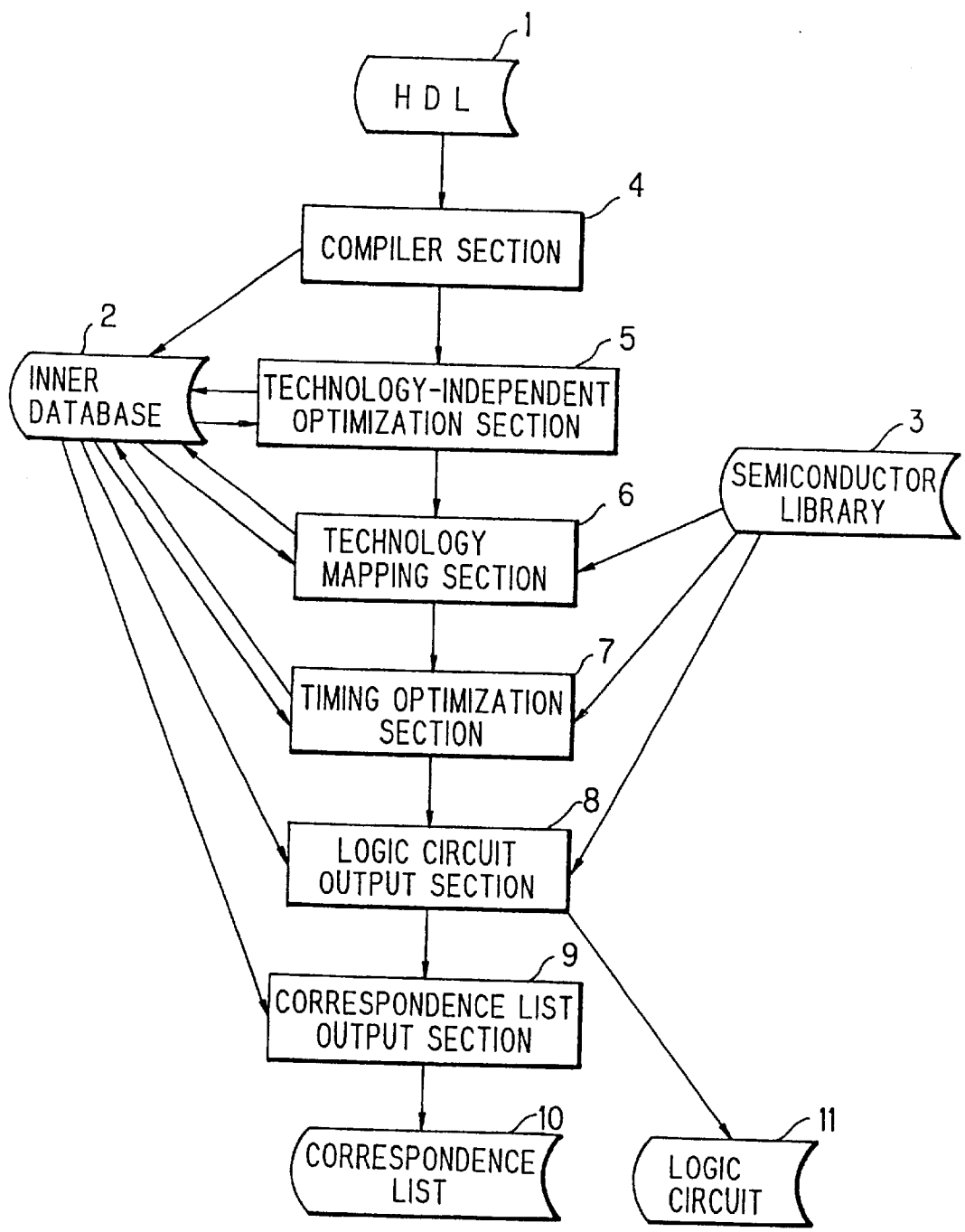
FIG. 1 is a block diagram illustrating a configuration of an apparatus for logic circuit synthesis according to a first embodiment of the invention.

FIG. 1 is a block diagram illustrating a configuration of an apparatus for logic circuit synthesis according to a first embodiment of the invention.

The apparatus of FIG. 1 comprises;

an inner database 2, a semiconductor library 3, a compiler section 4 for compiling a HDL description 1 into a logical network, wherein boundary information concerning intermediate signals defined in the HDL description 1 is included, to be stored in the inner database 2, a technology-independent optimization section 5 for performing technology-independent optimization of the logical network retaining the boundary information, a technology mapping section 6 for generating a hardware network to be stored in the inner database 2, by assigning a matching hardware unit in the semiconductor library 3 to each of logical blocks of the logical network after optimized through the technology-independent optimization section 5, also retaining the boundary information, a timing optimization section 7 for performing optimization of the hardware network referring to the semiconductor library 3 also retaining the boundary information, making use of optimization methods such as the fan-out correction, the fan-ill reordering, the decomposition in consideration of timings and the inverter motion, a logic circuit output section 8 for generating a logic circuit 11 to be output according to the hardware network after processed through the timing optimization section 7 referring to the semiconductor library 3, and a correspondence list output section 9 for outputting a correspondence list 10 describing information of each respective point of the logic circuit 11 corresponding to each of the intermediate signals included in the boundary information, by editing the boundary information retained in the inner database 2 referring to the semiconductor library 3.

Figure 2:
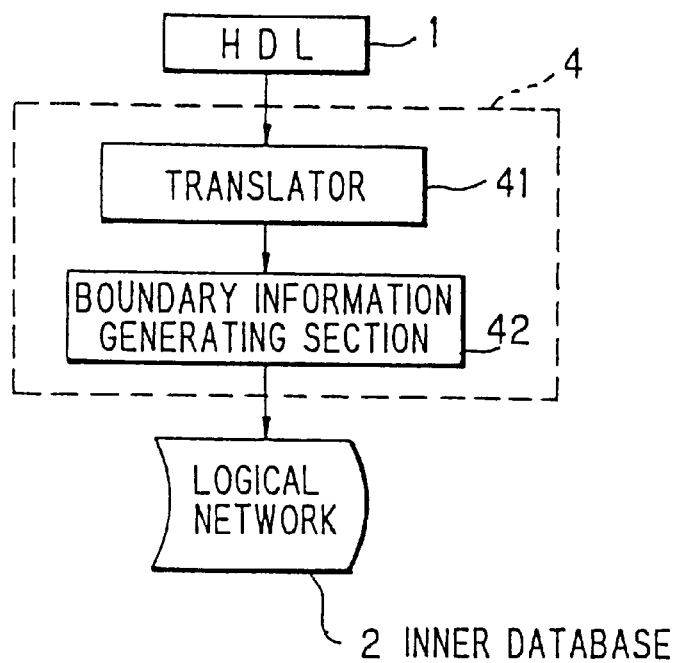
FIG. 2 is a block diagram illustrating a configuration of the compiler section 4 of FIG. 1.

FIG. 2 is a block diagram illustrating a configuration of the compiler section 4.

Referring to FIG. 2, the compiler section 4 comprises a translator 41 and a boundary information generating section 42.

The translator 41 generates a logical network without boundary information according to the HDL description 1 in the same way as all ordinary translator used in conventional logic circuit synthesis, that is, the HDL description 1 is transformed by the translator 41 into a primitive logical network, wherein each of symbols or logical equations in the HDL description 1 including intermediate signals is simply transferred into equivalent each of simple nodes, links or logical blocks of the primitive logical network consisting of primitive gates such as AND/OR gates. Here each of symbols of the intermediate signal is transferred into a node accompanied by a signal name of corresponding each the intermediate signals.

The boundary information generating section 42 extracts the boundary information from the primitive logical network generated by the translator 41 by searching every node accompanied by a signal name in the primitive logical network.

In the boundary information, an intermediate signal is represented with a signal name; a point, which corresponds to the intermediate signal, is represented with a name of a corresponding functional block and a name of its output terminal, and relation between the intermediate signal and the corresponding point is represented with a binary flag POS or NEG, the flag POS denoting that the corresponding point outputs the same logic with the intermediate signal and the flag NEG denoting that it outputs inverted logic of the intermediate signal.

By way of example, suppose following logical equations are described in the HDL description 1.

$$A=(I1+I2)*I3 \quad (1)$$

$$B=A+I4 \quad (2)$$

$$C=A+I5 \quad (3)$$

Here, operators + and * denote OR and AND logical operations, respectively.

Figure 3:
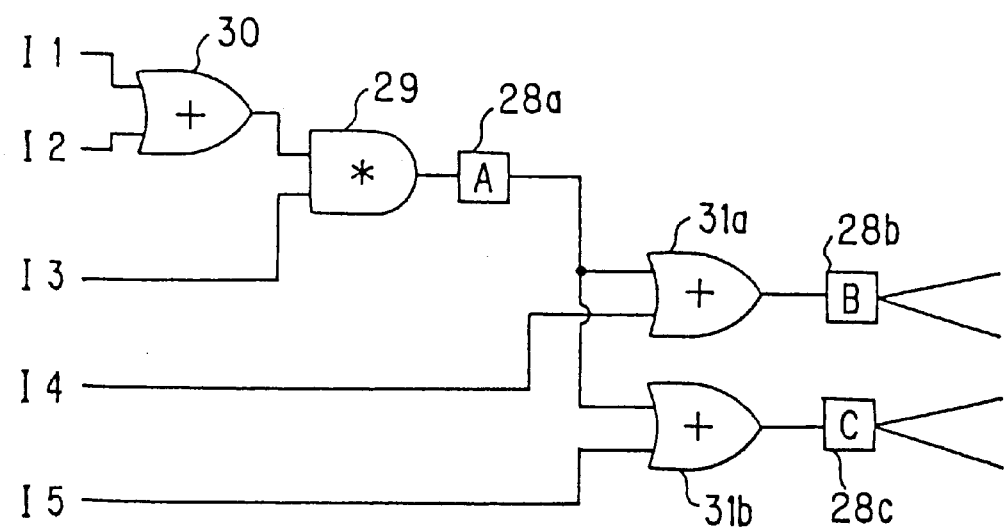
FIG. 3 is a block diagram illustrating an example of a primitive logical network generated by the translator 41 of FIG. 2.

From the description, the translator 41 generates a primitive logical network as illustrated in a block diagram of FIG. 3, wherein the above logical equation (1) is transformed into all OR gate 30, an AND gate 29 and a node 28a connected with necessary links, the logical equation (2) being transformed into an OR gate 31a and a node 28b, and the logical equation (3) into an OR gate 31b and a node 28c, in the same way.

In the primitive logical network of FIG. 3, the intermediate signals A, B and C are transformed into the nodes 28a to 28c accompanied by respective intermediate signal names, which have no logical function and remain simply for identifying respective intermediate signals in the HDL description 1.

Figure 4:
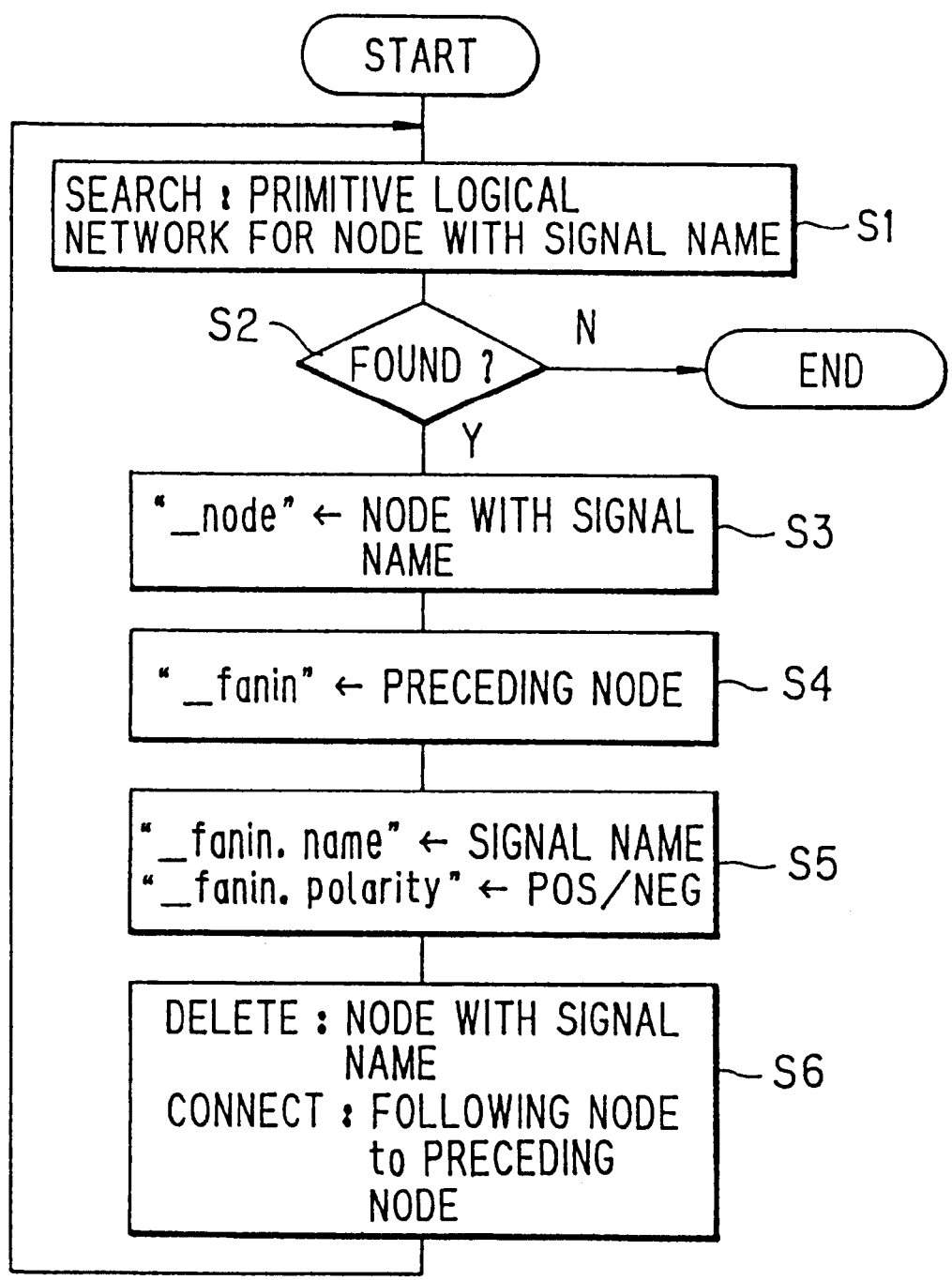
FIG. 4 is a flowchart illustrating operational steps performed in the boundary information generating section 42 of FIG. 2.

Now, operational steps performed in the boundary information generating section 42 will be described referring to a flowchart of FIG. 4.

The primitive logical network is searched by the boundary information generating section 42 for a simple node accompanied by a signal name (at step S1). When there is found any (at step S2), the simple node (the node 28a of FIG. 3, for example) is set to a variable "_node" (at step S3). Then, the boundary information generating section 42 sets a preceding node (the AND gate 29, in the example) to another variable "_fanin" (at step S4), and attaches the name 'A' of the node 28a set in the variable "_node" as the boundary information of the AND gate 29 set in the variable "_fanin" together with the output terminal ID (identifier) 'O1' and the relation POS (at step S5). Then, the nodes (the OR gates 31a and 31b) following the simple node (28a) set in the variable "_node" are directly connected to the node (the AND gate 29) set in the variable "_fanin" and the simple node (28a) of the variable "_node" is erased (at step S6) from the primitive logical network.

Then, the control process is returned to step S1 for repeating steps S1 to S6 until no simple node accompanied by a signal name is found at step S2.

Figure 5:
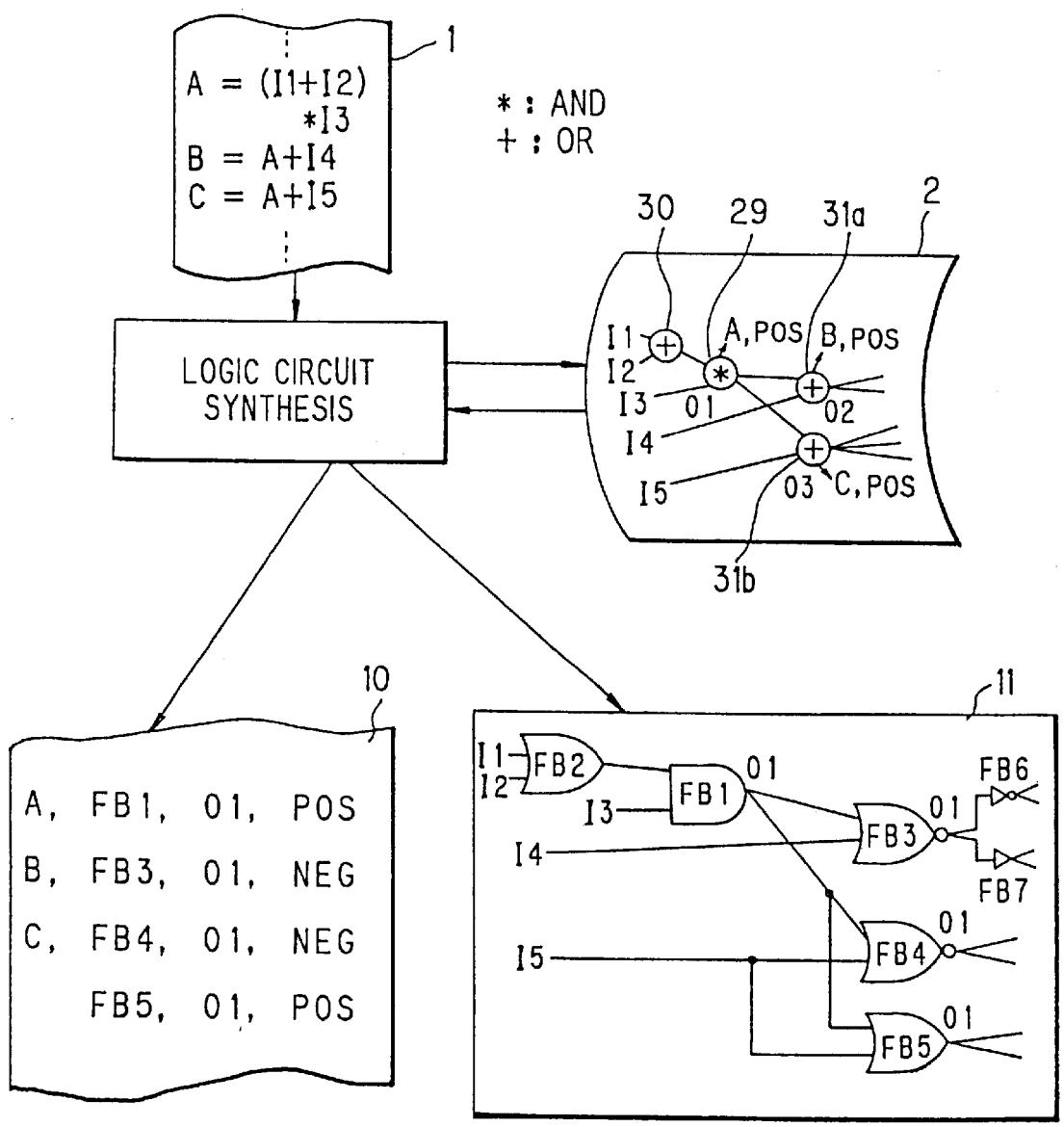
FIG. 5 is a schematic diagram illustrating examples of the HDL description 1, the logical network generated in the inner database 2, the correspondence list 10 and the logic circuit 11 of FIG. 1.

Thus, the logical network with the boundary information is prepared in the inner database 2 as illustrated in a schematic diagram of FIG. 5.

Returning to FIG. 1, the technology-independent optimization section 5 performs technology-independent optimization of the logical network prepared in the internal database 2, making use of appropriate optimization methods such as the constant propagation, the redundancy removal, the global flow analysis, the transduction, the cube factoring and the kernel factoring, in the same way with the conventional logic circuit synthesis, but retaining the boundary information so that any of logical blocks whereto a name of an intermediate signal is assigned may not be omitted.

The technology mapping section 6 generates a hardware network by assigning a matching hardware unit, or an appropriate functional block in the semiconductor library 3, to each of the logical blocks of the logical network with the boundary information after processed through the technology-independent optimization section 5. Thus, the logical network with the boundary information in the inner database 2 is transformed into a hardware network with the boundary information.

The timing optimization section 7 performs optimization of the hardware network with the boundary information stored in the inner database 2 referring to the semiconductor library 3, so that any of functional blocks whereto a name of all intermediate signal is assigned may not be omitted, making use of optimization methods such as the fan-out correction, the fan-in reordering, the decomposition in consideration of timings, and the inverter motion. Here, the polarity (POS/NEG), and the output terminal, if necessary, of the boundary information may be changed according to the inverter motion or the fan-in reordering, for example.

For example, the logical network stored in the inner database 2 of FIG. 5 is transferred and optimized into a hardware network represented by a logic circuit 11 of FIG. 5, wherein functional blocks FB6 and FB7 representing an inverter and a buffer, respectively, are added for reinforcing fan-out ability of a functional block FB3 corresponding to the OR gate 31a for outputting the intermediate signal B. Further, in the example of the logic circuit 11 of FIG. 5, the OR gate 31b for outputting the intermediate signal C is realized with a parallel pair of functional blocks FB4 (NOR gate) and FB5 (OR gate) for ensuring high-speed operation. Therefore, the intermediate signal C is realized with an inverted output of the functional block FB4 and also with a non-inverted output of the functional block FB5.

Then, the logic circuit output section 8 generates a logic circuit 11 to be output, as illustrated in FIG. 5, according to the hardware network with the boundary information after processed through the timing optimization section 7, referring to the semiconductor library 3.

Finally, the correspondence list output section 9 outputs the correspondence list 10 as illustrated in FIG. 5, wherein information of each respective point of the logic circuit 11 is described corresponding to each of intermediate signals defined in the HDL description 1, by editing the boundary information retained in the inner database 2. The example of the correspondence list 10 of FIG. 5 describes that the intermediate signal A is realized by output logic (POS) of output terminal O1 of function block FB1, the intermediate signal B is realized by inverted output logic (NEG) of output terminal O1 of function block FB3, and the intermediate signal C is realized by inverted output logic (NEG) of output terminal O1 of function block FB4 and also by output logic (POS) of output terminal O1 of function block FB5.

As heretofore described, the boundary information, which is extracted by the boundary information generating section 42 (FIG. 2) from the HDL description 1 concerning intermediate signals defined therein, is retained at every stage of transformation in the logic circuit synthesis and finally output as the correspondence list 11 in the first embodiment. Therefore, the designer of the logic circuit call easily discriminate which intermediate signal of the HDL description 1 corresponds to which point of the synthesized logic circuit.

Figure 6:
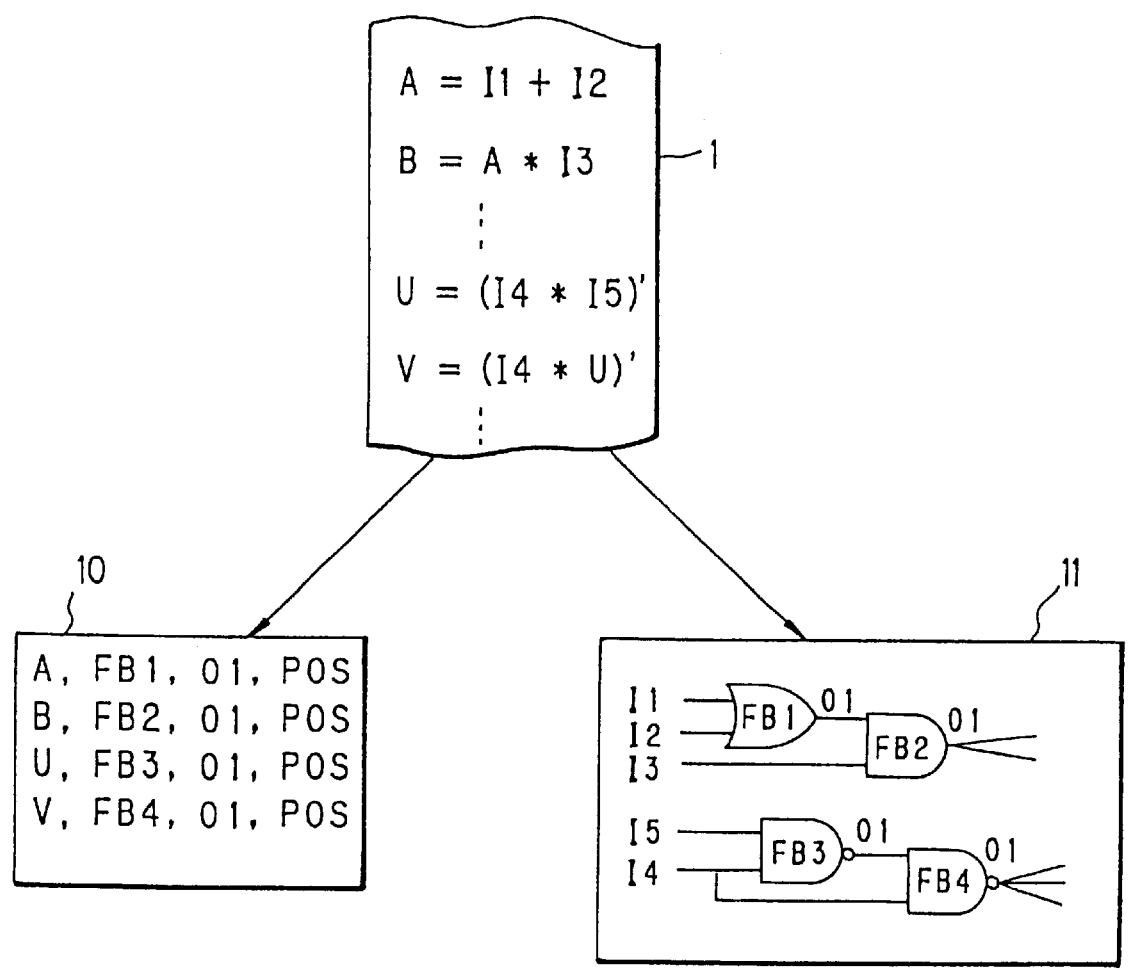
FIG. 6 is an illustration of another example of the HDL description 1, the correspondence list 10 and the logic circuit 11.

FIG. 6 is an illustration of another example of the HDL description 1, and the correspondence list 10 and the logic circuit 11 generated therefrom, by the logic circuit synthesis according to the above first embodiment. In the examples of FIG. 6, following logical equations (4) to (7);

$$A = I1 + I2 \quad (4)$$

$$B = A * I3 \quad (5)$$

$$U = (I4 * I5)', \text{ and} \quad (6)$$

$$V = (I4 * U)', \quad (7)$$

wherein a sign ' denotes inversion, are transformed into frictional blocks FB1 of OR gate, FB2 of AND gate and FB3 and FB4 of NAND gates in the logic circuit 11, and each of the intermediate signals A, B, U and V are described to be output logic (POS) of output, terminal O1 of each of the functional blocks FB1 to FB4, respectively, in the correspondence list 10.

In the following paragraphs, a second embodiment of the invention is described.

Figure 7:
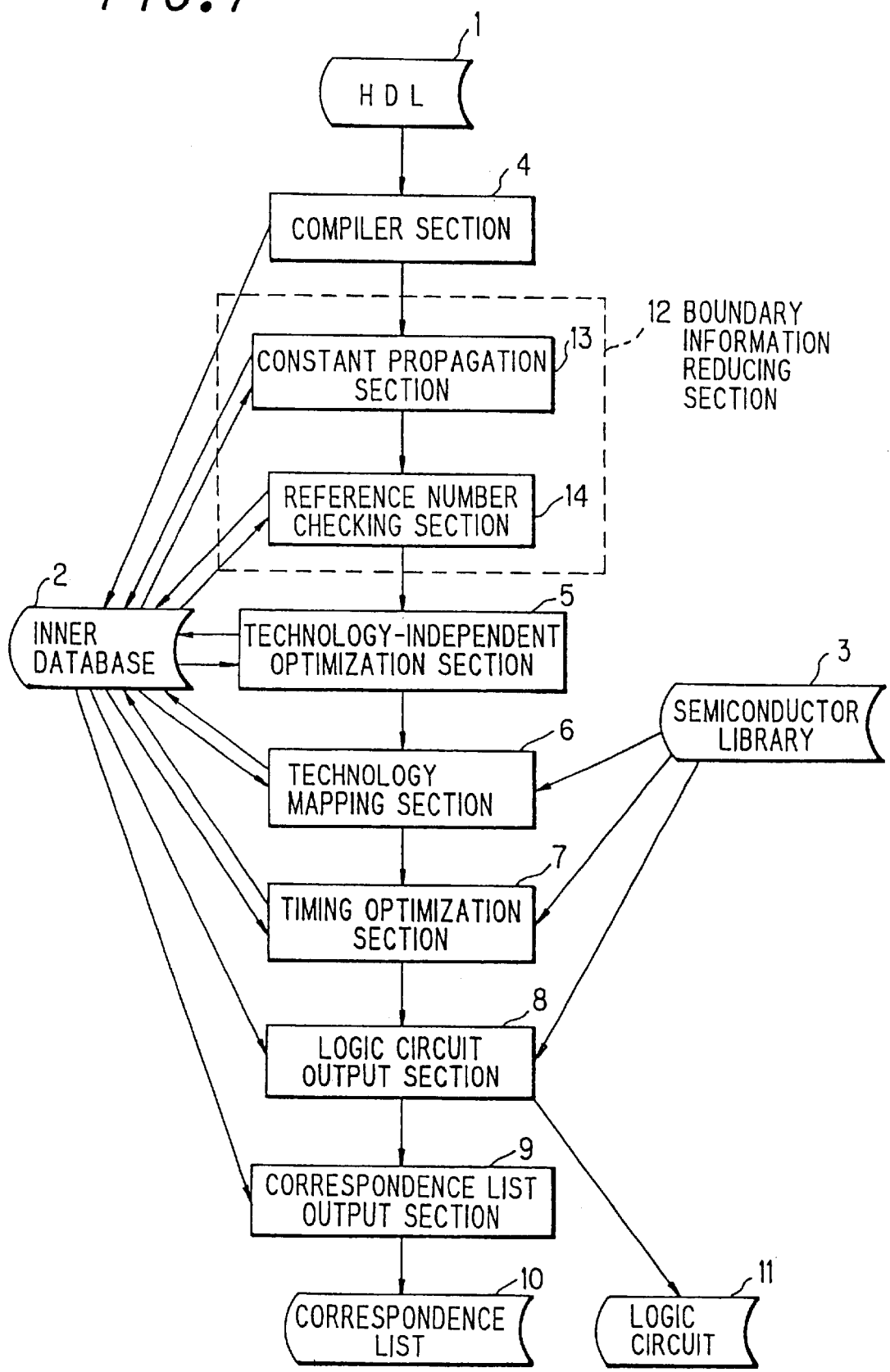
FIG. 7 is a block diagram illustrating an apparatus for the logic circuit synthesis according to a second embodiment of the invention.

FIG. 7 is a block diagram illustrating an apparatus for the logic circuit synthesis according to the second embodiment, wherein a boundary information reducing section 12 is provided between the compiler section 4 and the technology-independent optimization section 5 of the embodiment of FIG. 1.

The boundary information reducing section 12 comprises a constant propagation section 13 and a reference number checking section 14.

The constant propagation section 13 performs technology-independent optimization concerning constant propagation even if a part of the boundary information is omitted.

Figure 8:
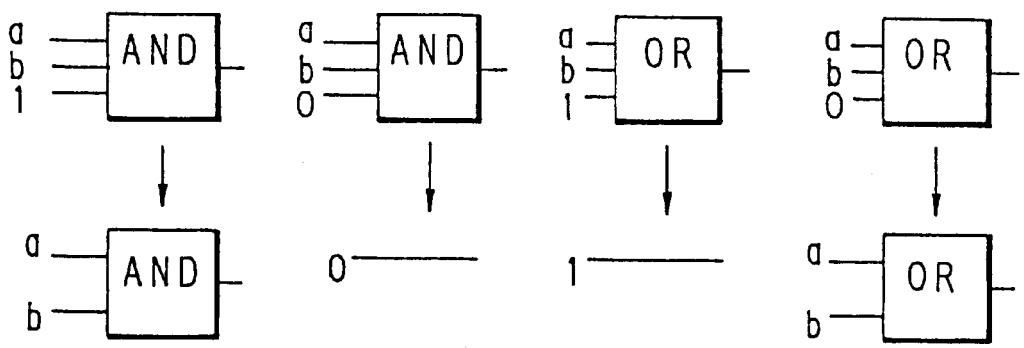
FIG. 8 illustrates some examples of constant propagation.

FIG. 8 illustrates some examples of the constant propagation, wherein AND logic of signals including a constant signal of logic '0' is replaced by an equivalent constant signal of logic '0', OR logic of signals including a constant signal of logic '1' is replaced with an equivalent constant signal of logic '1', and a constant signal of logic '1' to be input to an AND gate and a constant signal of logic '0' to be input to an OR gate are both ignored.

Therefore, some logical blocks may be eliminated together with the boundary information attached thereto concerning the corresponding intermediate signals. However, the boundary information to be omitted by the constant propagation has little significance. Hence, the constant propagation section 13 of the second embodiment is allowed to perform the technology-independent optimization making use of the constant propagation for enabling better optimization.

Then, reference number checking section 14 checks whether a fan-out number of a node, that is, a number of nodes which refer to th( .concerning node, is more or not than a parameter N given by the designer, for every node accompanied by boundary information, and erases the boundary information of nodes which give fan-out numbers not more than the parameter N.

Figure 9:
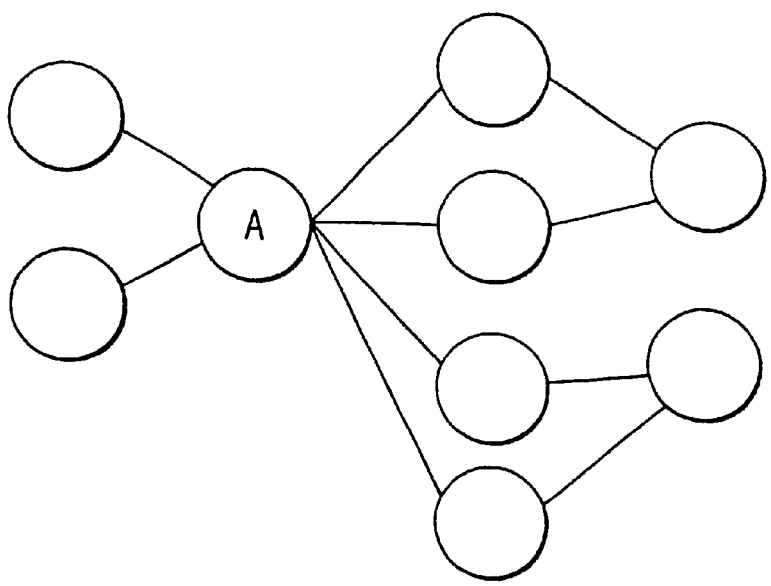
FIG. 9 is a schematic diagram for illustrating a fan-out number of a node in a logical network.

For example, the fan-out number of a node A of a logical network illustrated in a schematic diagram of FIG. 9 is four. Therefore, the boundary information attached to the node A is erased when the parameter N is designated to be four or more, by the designer.

The technology-independent optimization section 5 and the timing optimization section 7 perform respective optimization in the same way as the first embodiment of FIG. 1, that, is, retaining the boundary information so that any of logical blocks in the logical network or functional blocks in the hardware network whereto a name of all intermediate signal is assigned may not be omitted. In other words, the technology-independent optimization section 5 and the timing optimization section 7 of the second embodiment can perform more optimization, because they are allowed to eliminate logical blocks or functional blocks wherefrom the boundary information is erased by the reference number checking section 14.

Figure 10:
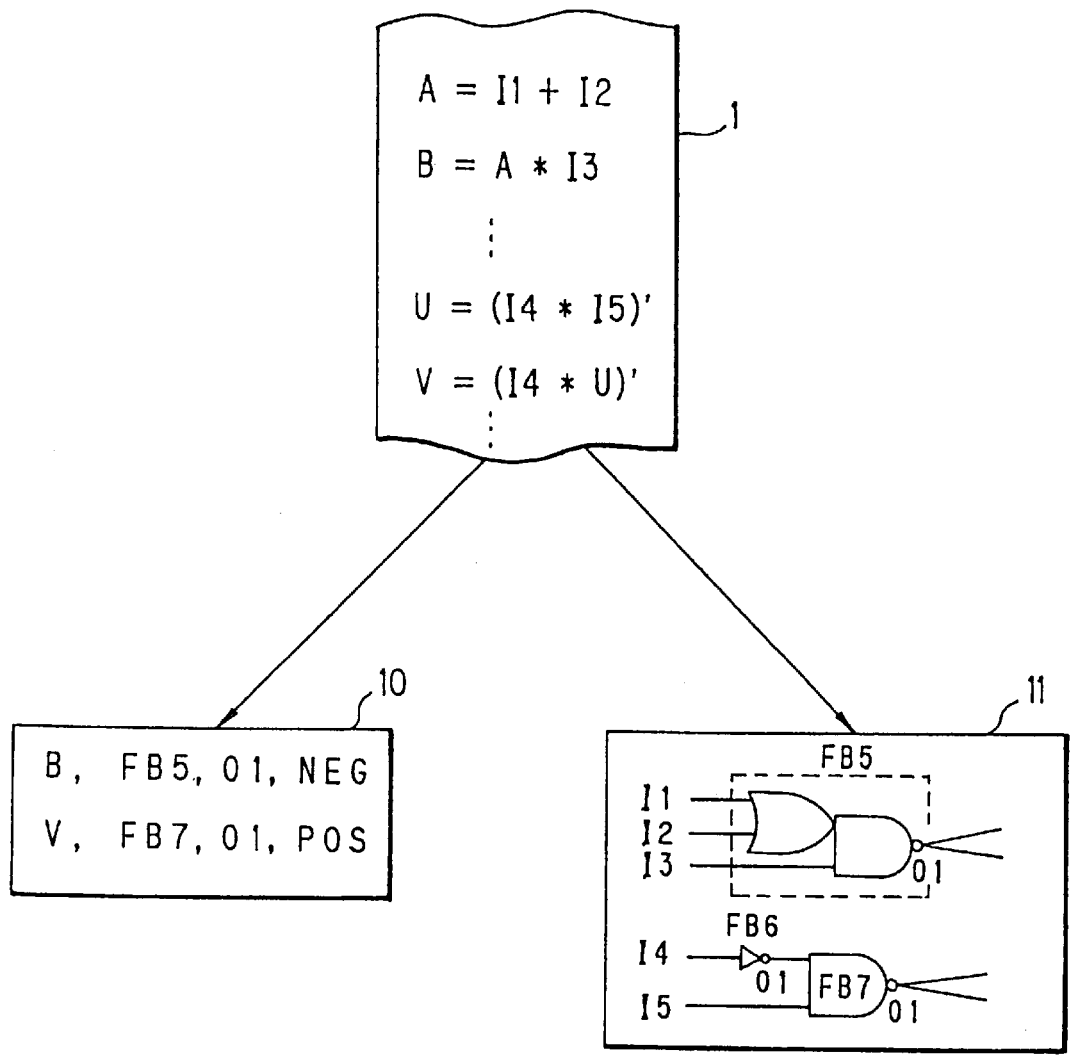
FIG. 10 is a schematic diagram illustrating an example of IN-OUT of the logic circuit synthesis of FIG. 7.
Figure 11:
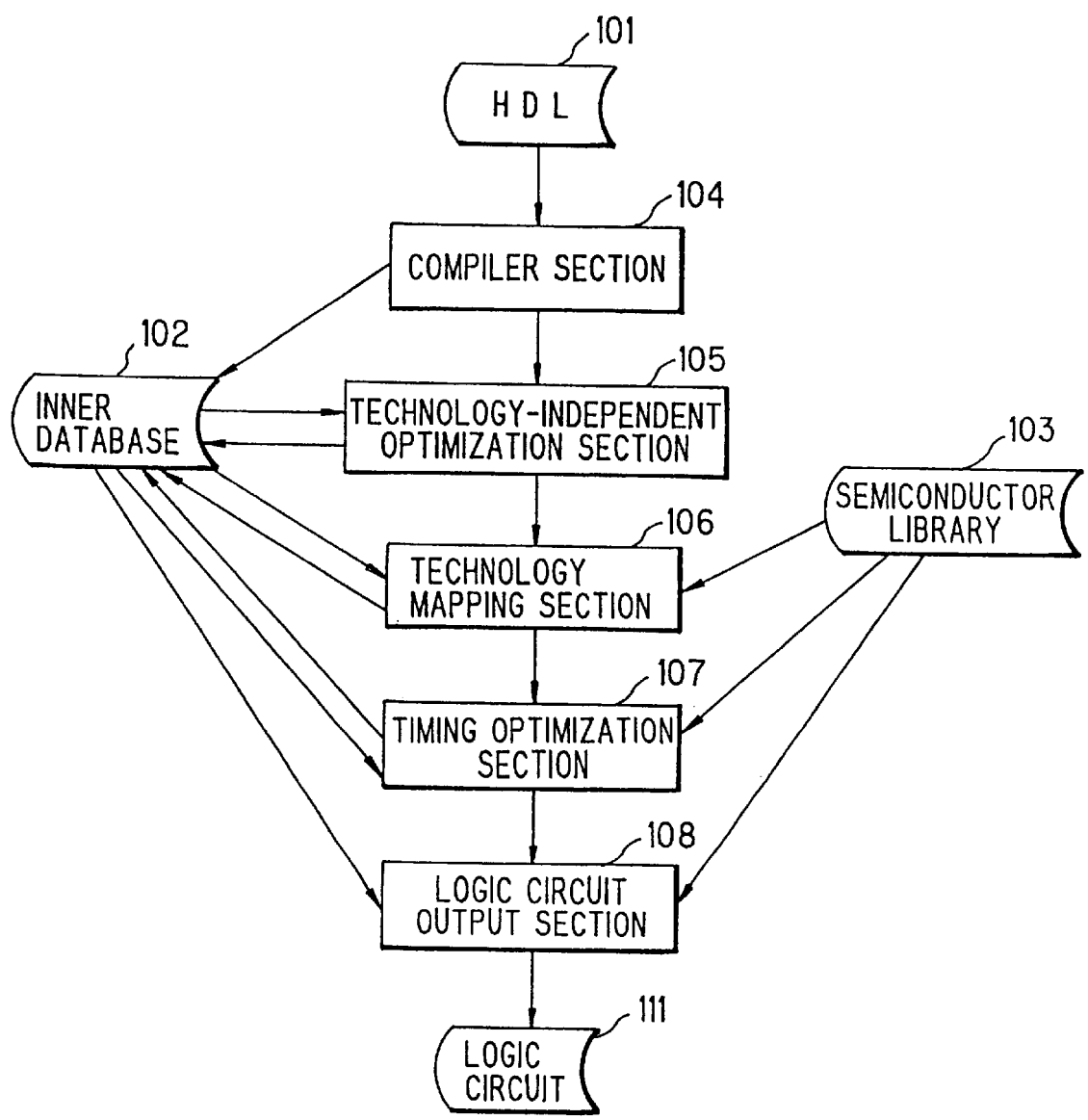
FIG. 11 is a block diagram schematically illustrating a structural flow of logic circuit synthesis according to a prior art.

FIG. 10 is a schematic diagram illustrating an example of logic circuit synthesis according to the second embodiment, wherein the same HDL description 1 illustrated in FIG. 6 is given by the designer together with the parameter N of one, and another logic circuit 11 and another correspondence list 10 are output according thereto.

In the example of FIG. 10, the reference number checking section 14 checks fan-out number of each node of the logical network and erases boundary information concerning intermediate signals A and U whereof each is found to be referred to by only one following node. Therefor, the functional blocks FBl (OR gate) and FB2 (AND gate) of FIG. 6 are optimized into an equivalent functional block FB5 (OR-NAND gate) of FIG. 10, and the functional blocks FB3 and FB4 (NAND gates) are optimized into functional blocks FB6 (inverter) and FB7 (NAND gates).

Thus, more effective optimization can be performed according to the second embodiment with little omission of the boundary information according to designer's option.

Heretofore, the embodiments of the invention are described to have configurations illustrated in the block diagrams of FIG. 1 and FIG. 7. However, it can be easily understood that each function of the embodiments represented by each respective block may be implemented separately or in combination with a computer program executed in a computer.

What is claimed is:

1. A method of logic circuit synthesis for automatically synthesizing a logic circuit according to a description of the logic circuit using a HDL (High-level Design Language); said method comprising steps of:

generating a logic circuit according to a HDL description always retaining boundary information concerning necessary intermediate signals defined in the HDL description; and outputting a correspondence list describing information of each respective point of the logic circuit corresponding to each of the necessary intermediate signals, by editing the boundary information, wherein:
said information in said correspondence list includes:
a signal name of each simple node in said logic circuit;
a function block identifier and an output terminal identifier of said function block feeding said simple node; and
one of (1) a positive flag for identifying that the function block outputs a signal with the same logic sign as the intermediate signal; and
(2) a negative flag for identifying that the function block outputs a signal with the opposite logical sign as the intermediate signal.

2. A method of logic circuit synthesis as recited in claim 1; said necessary intermediate signals are all intermediate signals defined in the HDL description.

3. A method of logic circuit synthesis as recited in claim 1; said necessary intermediate signals are variable intermediate signals defined in the HDL description and referred to by more than a predetermined number of nodes of the logic circuit.

4. A method of logic circuit synthesis for automatically synthesizing a logic circuit according to a description of the logic circuit using a HDL; said method comprising steps of:

compiling a HDL description into a logical network, wherein boundary information concerning intermediate signals defined in the HDL description is included;

performing technology-independent optimization of the logical network retaining the boundary information;

transforming the optimized logical network into a hardware network retaining the boundary information, by assigning a matching hardware unit in a semiconductor library to each of logical blocks of the logical network after performing the technology-independent optimization;

performing optimization of the hardware network referring to the semiconductor library and retaining the boundary information, the optimization of the hardware network being performed concerning at least one of circuit size, operational speed and power consumption of a logic circuit to be designed according to the hardware network;

generating the logic circuit to be output referring to the semiconductor library according to the hardware network after performing the optimization of the hardware network; and outputting a correspondence list describing information of each respective point of the logic circuit corresponding to each of intermediate signals included in the boundary information, by editing the boundary information, wherein:
said information in said correspondence list includes:
a signal name of each simple node in said logic circuit;
a function block identifier and an output terminal identifier of said function block feeding said simple node; and
one of (1) a positive flag for identifying that the function block outputs a signal with the same logic sign as the intermediate signal; and
(2) a negative flag for identifying that the function block outputs a signal with the opposite logical sign as the intermediate signal.

5. A method of logic circuit synthesis as recited in claim 4; said step of compiling comprising steps of:

generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals;

extracting the boundary information from the primitive logical network by searching the primitive logical network for every node accompanied by a signal name; and erasing each node accompanied by a signal name in the primitive logical network, by attaching the boundary information including the signal name to a preceding node of said each node and connecting every of following node of said each node to the preceding node.

6. A method of logic circuit synthesis for automatically synthesizing a logic circuit according to a description of the logic circuit using a HDL; said method comprising steps of:

compiling a HDL description into a logical network, wherein boundary information concerning intermediate signals defined in the HDL description is included;

performing constant propagation optimization of the logical network wherein the boundary information concerning intermediate signals found to be constant is allowed to be erased;

performing boundary information reduction by checking whether a fan-out number of a node is more than a predetermined number for every node of the logical network accompanied by the boundary information concerning any of the intermediate signals, and erasing the boundary information of nodes each giving the fan-out number not more than the predetermined number;

performing technology-independent optimization of the logical network retaining the boundary information which is left not erased along with the constant propagation optimization and the boundary information reduction;

transforming the optimized logical network into a hardware network retaining the boundary information, by assigning a matching hardware unit in a semiconductor library to each of logical blocks of the logical network after performing the technology-independent optimization;

performing optimization of the hardware network referring to the semiconductor library and retaining the boundary information, the optimization of the hardware network being performed concerning at least one of circuit size, operational speed and power consumption of a logic circuit to be designed according to the hardware network;

generating the logic circuit to be output referring to a semiconductor library according to the hardware network after performing the optimization of the hardware network; and outputting a correspondence list describing information of each respective point of the logic circuit corresponding to each of intermediate signals included in the boundary information, by editing the boundary information, wherein:

said information in said correspondence list includes:
a signal name of each simple node in said logic circuit;
a function block identifier and an output terminal identifier of said function block feeding said simple node; and
one of (1) a positive flag for identifying that the function block outputs a signal with the same logic sign as the intermediate signal; and
(2) a negative flag for identifying that the function block outputs a signal with the opposite logical sign as the intermediate signal.

7. A method of logic circuit synthesis as recited in claim 6; said step of compiling comprising steps of:

generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals;

extracting the boundary information from the primitive logical network by searching the primitive logical network for every node accompanied by a signal name; and erasing each node accompanied by a signal name in the primitive logical network, by attaching the boundary information including the signal name to a preceding node of said each node and connecting every of following node of said each node to the preceding node.

8. An apparatus for logic circuit synthesis for automatically synthesizing a logic circuit according to a description of the logic circuit using a HDL; said apparatus comprising:

a compiler section for compiling a HDL description into a logical network, wherein boundary information concerning intermediate signals defined in the HDL description is included;

a technology-independent optimization section for performing technology-independent optimization of the logical network retaining the boundary information;

a technology mapping section for transforming the optimized logical network into a hardware network retaining the boundary information, by assigning a matching hardware unit in a semiconductor library to each of logical blocks of the logical network after processed with the technology-independent optimization;

a timing optimization section for performing optimization of the hardware network referring to the semiconductor library and retaining the boundary information, the optimization of the hardware network being performed concerning at least one of circuit size, operational speed and power consumption of a logic circuit to be designed according to the hardware network;

a logic circuit output section for generating the logic circuit to be output referring to the semiconductor library according to the hardware network after performing the optimization of the hardware network; and a correspondence list output section for outputting a correspondence list describing information of each respective point of the logic circuit corresponding to each of intermediate signals included in the boundary information, by editing the boundary information, wherein:

said information in said correspondence list includes:
a signal name of each simple node in said logic circuit;
a function block identifier and an output terminal identifier of said function block feeding said simple node; and
one of (1) a positive flag for identifying that the function block outputs a signal with the same logic sign as the intermediate signal; and
(2) a negative flag for identifying that the function block outputs a signal with the opposite logical sign as the intermediate signal.

9. An apparatus for logic circuit synthesis as recited in claim 8; said compiler section comprising:

a translator for generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals; and a boundary information generating section for extracting the boundary information from the primitive logical network by searching the primitive logical network for every node accompanied by a signal name, and erasing each node accompanied by a signal name in the primitive logical network, by attaching the boundary information including the signal name to a preceding node of said each node and connecting every of following node of said each node to the preceding node.

10. An apparatus for logic circuit synthesis for automatically synthesizing a logic circuit according to a description of the logic circuit using a HDL; said apparatus comprising:

a compiler section for compiling a HDL description into a logical network, wherein boundary information concerning intermediate signals defined in the HDL description is included;

a constant propagation section for performing constant propagation optimization of the logical network wherein the boundary information concerning intermediate signals found to be constant is allowed to be erased;

a reference number checking section for performing boundary information reduction by checking whether a fan-out number of a node is more than a predetermined number for every node of the logical network accompanied by the boundary information concerning any of the intermediate signals, and erasing the boundary information of nodes each giving the fan-out number not more than the predetermined number;

a technology-independent optimization section for performing technology-independent optimization of the logical network retaining the boundary information which is left not erased along with the constant propagation optimization and the boundary information reduction;

a technology mapping section for transforming the optimized logical network into a hardware network retaining the boundary information, by assigning a matching hardware unit in a semiconductor library to each of logical blocks of the logical network after processed with the technology-independent optimization;

a timing optimization section for performing optimization of the hardware network referring to the semiconductor library and retaining the boundary information, the optimization of the hardware network being performed concerning at least one of circuit size, operational speed and power consumption of a logic circuit to be designed according to the hardware network;

a logic circuit output section for generating the logic circuit to be output referring to the semiconductor library according to the hardware network after performing the optimization of the hardware network; and a correspondence list output section for outputting a correspondence list describing information of each respective point of the logic circuit corresponding to each of intermediate signals included in the boundary information, by editing the boundary information, wherein:

said information in said correspondence list includes:
  a signal name of each simple node in said logic circuit;
  a function block identifier and an output terminal identifier of said function block feeding said simple node; and
  one of (1) a positive flag for identifying that the function block outputs a signal with the same logic sign as the intermediate signal; and
  (2) a negative flag for identifying that the function block outputs a signal with the opposite logical sign as the intermediate signal.

11. An apparatus for logic circuit synthesis as recited in claim 10; said compiler section comprising:

a translator for generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals; and a boundary information generating section for extracting the boundary information from the primitive logical network by searching the primitive logical network for every node accompanied by a signal name, and erasing each node accompanied by a signal name in the primitive logical network, by attaching the boundary information including the signal name to a preceding node of said each node and connecting every of following node of said each node to the preceding node.

12. A recording medium wherein a computer program to be implemented with a computer for performing a procedure to automatically synthesize a logic circuit according to a description of the logic circuit using a HDL is recorded; said procedure comprising steps of:

compiling a HDL description into a logical network, wherein boundary information concerning intermediate signals defined in the HDL description is included;

performing technology-independent optimization of the logical network retaining the boundary information;

transforming the optimized logical network into a hardware network retaining the boundary information, by assigning a matching hardware unit in a semiconductor library to each of logical blocks of the logical network after performing the technology-independent optimization;

performing optimization of the hardware network referring to the semiconductor library and retaining the boundary information, the optimization of the hardware network being performed concerning at least one of circuit size, operational speed and power consumption of a logic circuit to be designed according to the hardware network;

generating the logic circuit to be output referring to the semiconductor library according to the hardware network after performing the optimization of the hardware network; and outputting a correspondence list describing information of each respective point of the logic circuit corresponding to each of intermediate signals included in the boundary information, by editing the boundary information, wherein:

said information in said correspondence list includes:
  a signal name of each simple node in said logic circuit;
  a function block identifier and an output terminal identifier of said function block feeding said simple node; and
  one of (1) a positive flag for identifying that the function block outputs a signal with the same logic sign as the intermediate signal; and
  (2) a negative flag for identifying that the function block outputs a signal with the opposite logical sign as the intermediate signal.

13. A recording medium as recited in claim 12; said step of compiling comprising steps of:

generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals;

extracting the boundary information from the primitive logical network by searching the primitive logical network for every node accompanied by a signal name; and erasing each node accompanied by a signal name in the primitive logical network, by attaching the boundary information including the signal name to a preceding node of said each node and connecting every of following node of said each node to the preceding node.

14. A recording medium wherein a computer program to be implemented with a computer for performing a procedure to automatically synthesize a logic circuit according to a description of the logic circuit using a HDL is recorded; said procedure comprising steps of:

compiling a HDL description into a logical network, wherein boundary information concerning intermediate signals defined in the HDL description is included;

performing constant propagation optimization of the logical network wherein the boundary information concerning intermediate signals found to be constant is allowed to be erased;

performing boundary information reduction by checking whether a fan-out number of a node is more than a predetermined number for every node of the logical network accompanied by the boundary information concerning any of the intermediate signals, and erasing the boundary information of nodes each giving the fan-out number not more than the predetermined number;

performing technology-independent optimization of the logical network retaining the boundary information which is left not erased along with the constant propagation optimization and the boundary information reduction;

transforming the optimized logical network into a hardware network retaining the boundary information, by assigning a matching hardware unit in a semiconductor library to each of logical blocks of the logical network after performing the technology-independent optimization;

performing optimization of the hardware network referring to the semiconductor library and retaining the boundary information, the optimization of the hardware network being performed concerning at least one of circuit size, operational speed and power consumption of a logic circuit to be designed according to the hardware network;

generating the logic circuit to be output referring to the semiconductor library according to the hardware network after performing the optimization of the hardware network; and outputting a correspondence list describing information of each respective point of the logic circuit corresponding to each of intermediate signals included in the boundary information, by editing the boundary information, wherein:

said information in said correspondence list includes:
  a signal name of each simple node in said logic circuit;
  a function block identifier and an output terminal identifier of said function block feeding said simple node; and
  one of (1) a positive flag for identifying that the function block outputs a signal with the same logic sign as the intermediate signal; and
  (2) a negative flag for identifying that the function block outputs a signal with the opposite logical sign as the intermediate signal.

15. A recording medium as recited in claim 14; said step of compiling comprising steps of:

generating a primitive logical network by simply transferring each of symbols and logical equations defined in the HDL description into equivalent each of simple nodes, links and logical blocks of the primitive logical network, each of symbols of the intermediate signal being transferred into a node accompanied by a signal name of corresponding each of the intermediate signals;

extracting the boundary information from the primitive logical network by searching the primitive logical network for every node accompanied by a signal name; and erasing each node accompanied by a signal name in the primitive logical network, by attaching the boundary information including the signal name to a preceding node of said each node and connecting every of following node of said each node to the preceding node.

* * * * *